United States Patent
Daginnus

(10) Patent No.: US 9,330,996 B2
(45) Date of Patent: May 3, 2016

(54) SEMICONDUCTOR MODULE SYSTEM, SEMICONDUCTOR MODULE ARRANGEMENT AND METHOD FOR MOUNTING A SEMICONDUCTOR MODULE ON A HEAT SINK

(71) Applicant: Infineon Technologies AG, Neubiberg (DE)

(72) Inventor: Michael Daginnus, Kirchlengern (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/253,301

(22) Filed: Apr. 15, 2014

(65) Prior Publication Data
US 2014/0312485 A1    Oct. 23, 2014

(30) Foreign Application Priority Data

Apr. 18, 2013  (DE) .......................... 10 2013 207 043

(51) Int. Cl.

| | |
|---|---|
| *H01L 23/34* | (2006.01) |
| *H01L 23/02* | (2006.01) |
| *H01L 23/00* | (2006.01) |
| *H01L 23/36* | (2006.01) |
| *H01L 23/04* | (2006.01) |
| *H01L 21/50* | (2006.01) |
| *H01L 23/427* | (2006.01) |

(52) U.S. Cl.
CPC ................ *H01L 23/34* (2013.01); *H01L 21/50* (2013.01); *H01L 23/02* (2013.01); *H01L 23/04* (2013.01); *H01L 23/36* (2013.01); *H01L 24/83* (2013.01); *H01L 23/4275* (2013.01); *H01L 2924/1301* (2013.01); *H01L 2924/13055* (2013.01); *H01L 2924/13091* (2013.01)

(58) Field of Classification Search
CPC . H01L 23/34; H01L 23/36; H01L 2023/4023; H01L 2023/405; H01L 2023/4087; H01L 2023/4093
USPC ......... 257/704, 726, 727, 276, 625, 675, 706, 257/708, 712–722, 796, E33.075, E31.131, 257/E23.051, E23.08–E23.113
See application file for complete search history.

(56) References Cited

U.S. PATENT DOCUMENTS

| | | | |
|---|---|---|---|
| 6,529,378 B2 * | 3/2003 | Wong et al. ................... | 361/704 |
| 2002/0086801 A1 | 7/2002 | Khatri | |
| 2005/0180115 A1 | 8/2005 | Chang et al. | |
| 2006/0268520 A1 | 11/2006 | Huang et al. | |
| 2009/0067133 A1 | 3/2009 | Li et al. | |

FOREIGN PATENT DOCUMENTS

| | | |
|---|---|---|
| DE | 10320186 A1 | 12/2004 |
| DE | 102011083224 A1 | 3/2013 |

* cited by examiner

*Primary Examiner* — Jasmine Clark
(74) *Attorney, Agent, or Firm* — Murphy, Bilak & Homiller, PLLC

(57) ABSTRACT

A semiconductor module system has a semiconductor module and a protective cover. The semiconductor module has a bottom side with a heat dissipation surface and a top side opposite the bottom side, the top side being separated from the bottom side in a vertical direction. The protective cover can be mounted irreleasably on the semiconductor module in such a way that, in a mounted state, the top side is exposed and the protective cover covers the heat dissipation surface. By virtue of the protective cover, a thermal interface material applied onto the heat dissipation surface can be protected.

19 Claims, 9 Drawing Sheets

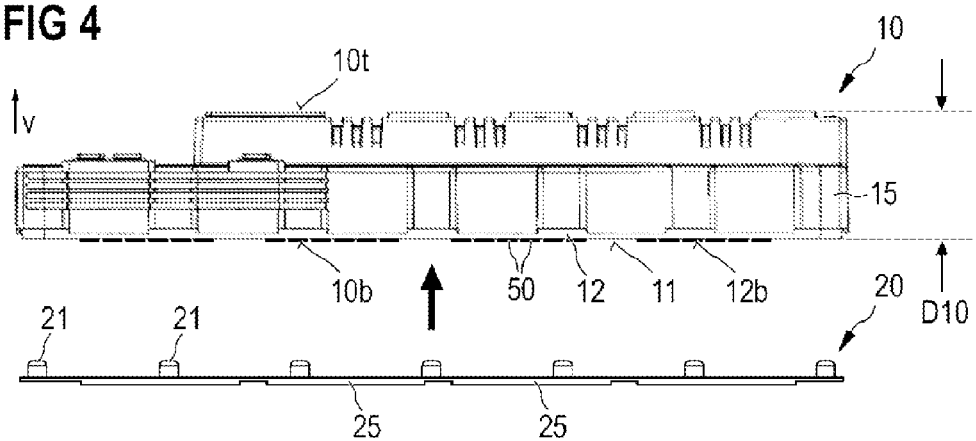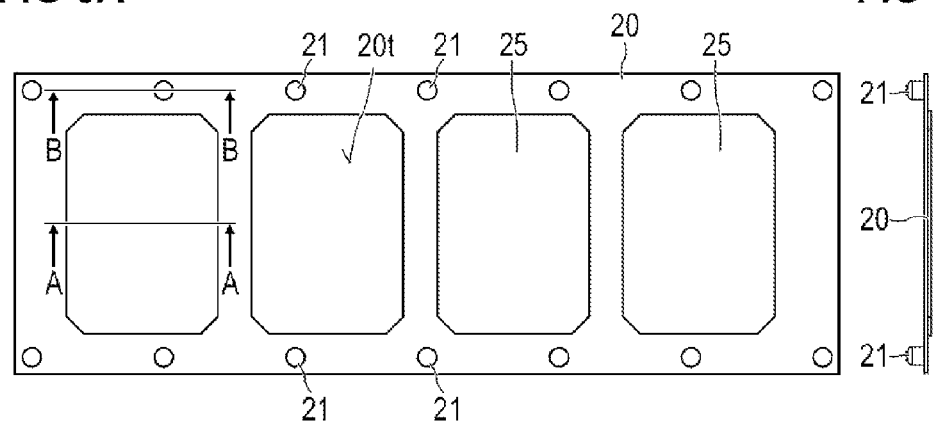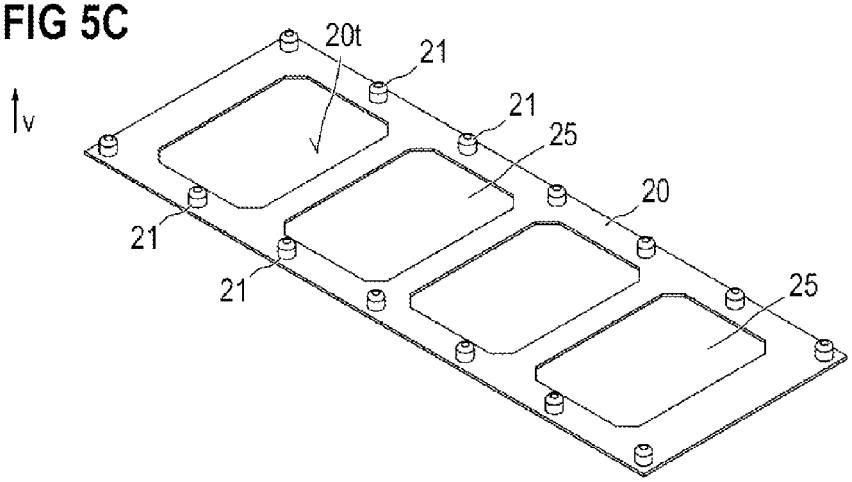

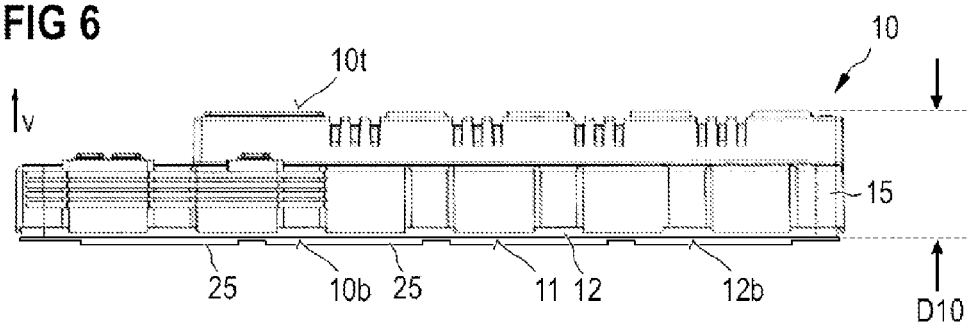
FIG 6
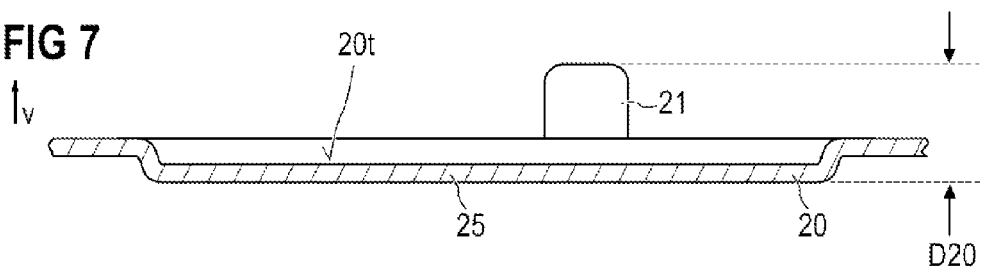
FIG 7
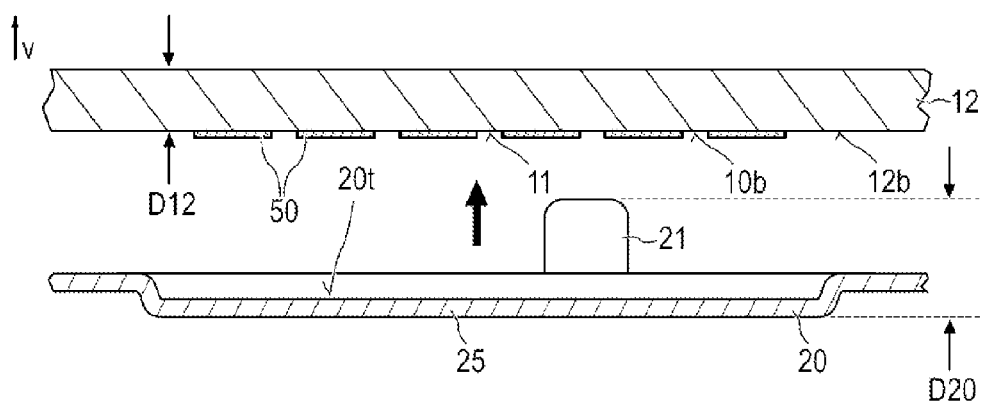
FIG 8A
FIG 8B
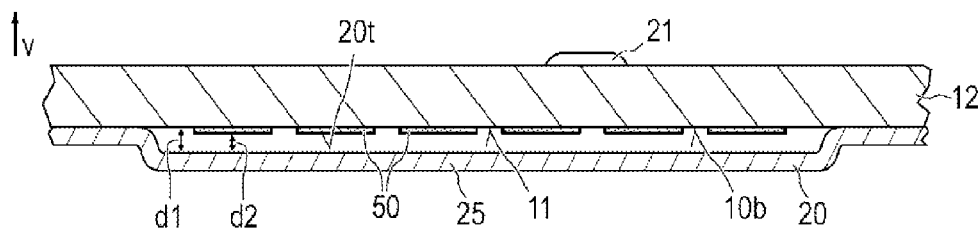

FIG 10
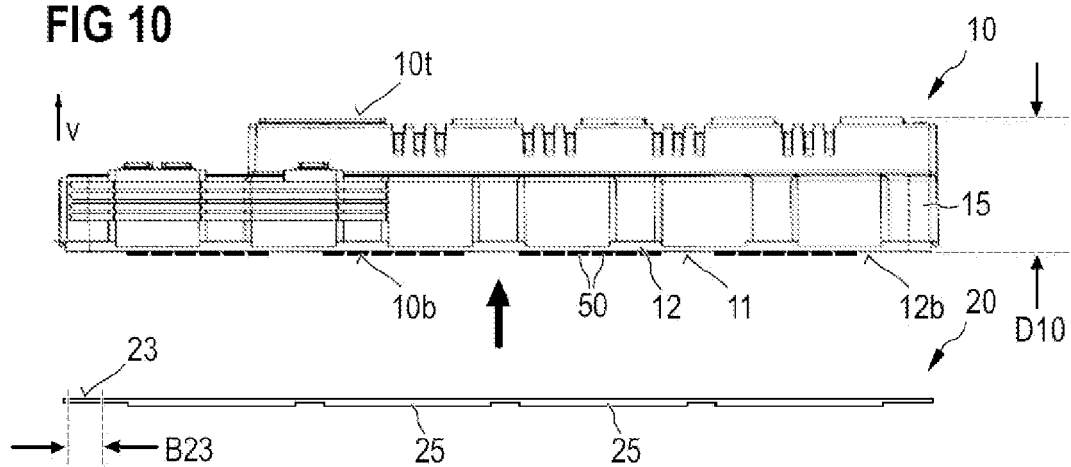
FIG 11A
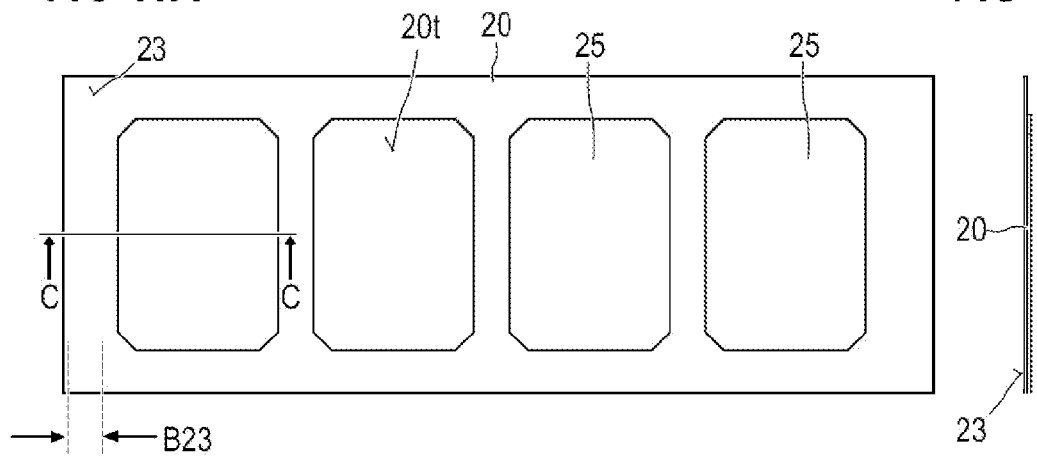
FIG 11B
FIG 11C
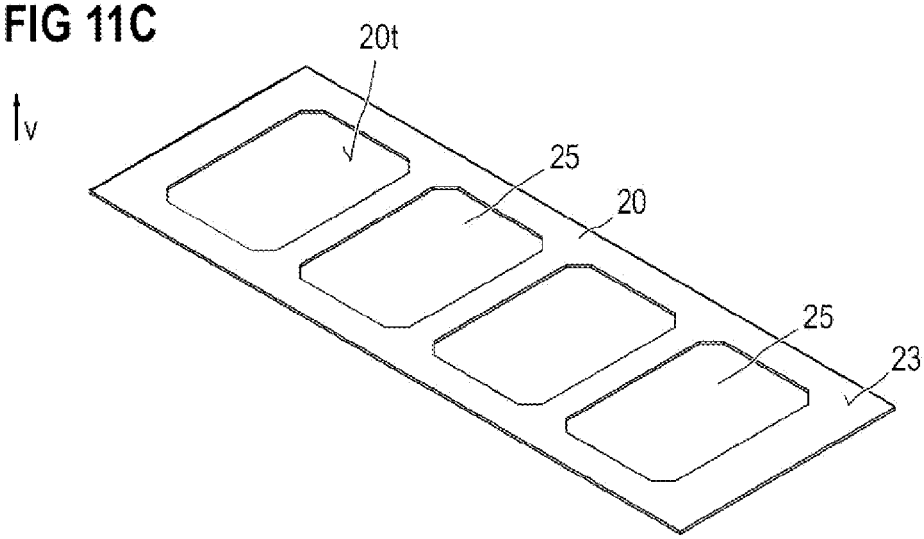

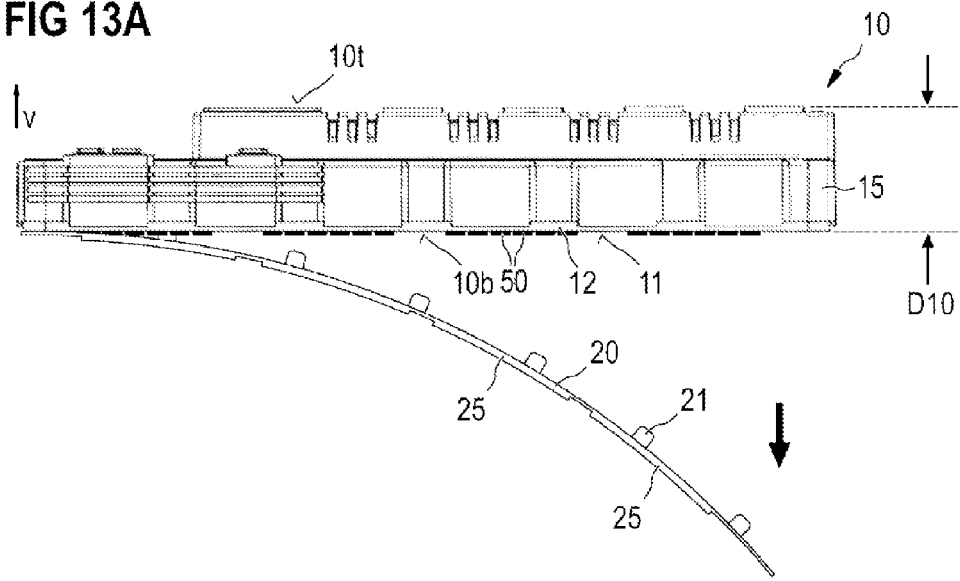
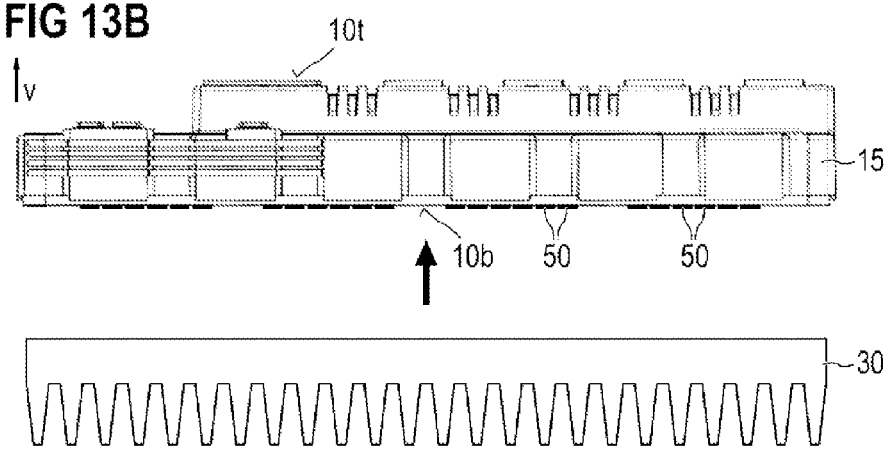
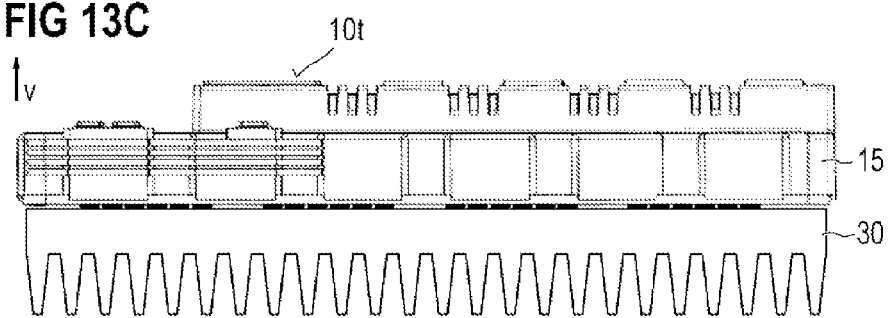

SEMICONDUCTOR MODULE SYSTEM, SEMICONDUCTOR MODULE ARRANGEMENT AND METHOD FOR MOUNTING A SEMICONDUCTOR MODULE ON A HEAT SINK

PRIORITY CLAIM

This application claims priority to German Patent Application No. 10 2013 207 043.8, filed on 18 Apr. 2013, the content of said German application incorporated herein by reference in its entirety.

TECHNICAL FIELD

The invention relates to a semiconductor module system, to a semiconductor module arrangement, and to a method for mounting a semiconductor module on a heat sink.

BACKGROUND

Particularly in power electronics, it is often necessary to dissipate the heat loss occurring in an electronic component or a module via a heat dissipation surface in the direction of a heat sink, on which the component or the module is mounted, in order to avoid overheating of the component or of the module.

It is particularly favorable for the heat dissipation surface to make contact over as large an area as possible with a corresponding mounting surface of the heat sink. Owing to unavoidable surface roughness and irregularities, however, the heat dissipation surface and the mounting surface touch only over a part of the maximum possible thermal contact surface, that is to say there are generally many points where the heat dissipation surface and the mounting surface are locally separated from one another. In order to reduce the heat transfer resistance in these regions, a thermal interface material (TIM) which compensates for the existing nonplanarities is conventionally used. Such thermal interface materials are, for example, thermally conductive pastes or thermally conductive sheets.

For heat conduction surfaces measuring at most a few square centimeters, and for relatively low power losses, these measures are normally sufficient. Larger heat dissipation surfaces, such as used for example in semiconductor modules, may however have much greater irregularity than small components. Furthermore, owing to different thermal expansion coefficients of components of the semiconductor module to be cooled, which are connected to one another, larger heat dissipation surfaces may bend to different extents depending on the temperature of components involved.

In such an arrangement, the risk arises that, after the thermal interface material has been applied onto the heat dissipation surface of the semiconductor module, it may inadvertently be smeared and/or contaminated, so that contamination of the surroundings occurs.

In order to achieve a particularly low heat transfer resistance between the semiconductor module and the heat sink, it is also known to apply the thermal interface material as a layer with a predetermined structure, for example with an inhomogeneous thickness and/or in a segmented fashion, onto the heat dissipation surface. However, it is very difficult to produce such a predetermined structure, for which reason it is advantageous for the application of the thermal interface material onto the heat dissipation surface to be carried out at the manufacturer of the semiconductor module, while the mounting of the semiconductor module provided with the thermal interface material on the heat sink takes place at the end customer. This, however, generally requires transport of the semiconductor module provided with the thermal interface material to the end customer, which increases the risk of smearing and/or contamination of the applied thermal interface material.

SUMMARY

It is an object of the present invention to provide a semiconductor module system and a semiconductor module arrangement, with which at least one, several or all of the aforementioned disadvantages can be avoided. It is a further object to provide a method for mounting a semiconductor module on a heat sink, with which at least one, several or all of the aforementioned disadvantages can be avoided.

A semiconductor module system comprises a semiconductor module having a bottom side and a top side, opposite the bottom side, which is separated from the bottom side in a vertical direction. The bottom side has a heat dissipation surface. The semiconductor module system furthermore contains a protective cover, which can be mounted irreleasably on the semiconductor module in such a way that, in the mounted state, the top side is exposed and the protective cover covers the heat dissipation surface.

With such a semiconductor module system, it is possible to produce a semiconductor module arrangement in which a thermal interface material is applied onto the heat dissipation surface in a structured or unstructured way, and in which the protective cover is mounted irreleasably on the semiconductor module and is separated from the thermal interface material.

In order to mount a semiconductor module on a heat sink, in the case of such a semiconductor module arrangement the protective cover is removed from the semiconductor module and the semiconductor module is then mounted on a heat sink which is provided, in such a way that the thermal interface material makes contact with the heat sink.

By virtue of the protective cover, the thermal interface material applied onto the semiconductor module is protected against external effects. The thermal interface material may be a conventional thermally conductive paste, in particular a phase-change material (PSM), that is to say a material whose viscosity decreases with an increasing operating temperature of the semiconductor module. In general, a thermal interface material may initially be in the form of a paste. The thermal interface material in the form of a paste may, for example, be applied onto the heat dissipation surface by the screen-printing method or by using a template provided with openings. After the application, the paste may optionally either remain permanently in paste form or be partially or fully dried, if the applied paste contains a solvent. In all variants of the invention, the thermal interface material may be configured in such a way that after application onto the heat dissipation surface and—if intended also after the partial or full drying—it returns to paste form when it is heated to a temperature of at least 45° C.

Those skilled in the art will recognize additional features and advantages upon reading the following detailed description, and upon viewing the accompanying drawings.

BRIEF DESCRIPTION OF THE DRAWINGS

The principles of the invention will be explained by way of example below with the aid of exemplary embodiments with reference to the appended figures. In the figures, unless otherwise indicated, references which are the same denote ele

FIG. 4 shows a side view of the semiconductor module according to FIGS. 1 to 3 after application of the thermal interface material onto the heat dissipation surface and before mounting of the protective cover;

FIG. 5A shows a plan view of the top side of a protective cover which can be mounted irreleasably on the semiconductor module according to FIGS. 1 to 4;

FIG. 5B shows a view of the protective cover according to FIG. 5A on its narrow side;

FIG. 5C shows a perspective view of the protective cover according to FIGS. 5A and 5B;

FIG. 6 shows a side view of the semiconductor module according to FIG. 4 after mounting of the protective cover;

FIG. 7 shows an enlarged view of a section of the protective cover according to FIG. 5A along a section line A-A;

FIG. 8A shows an enlarged view of the section of the protective cover according to FIG. 7 before mounting of the protective cover on the semiconductor module;

FIG. 8B shows the view according to FIG. 8A after mounting of the protective cover on the semiconductor module;

FIG. 10 shows a side view of a semiconductor module and of a protective cover which can be mounted thereon, which does not have any projections with which it can be fastened irreleasably on the semiconductor module;

FIG. 11A shows a plan view of the top side of the protective cover according to FIG. 10;

FIG. 11B shows a view of the protective cover according to FIG. 11A on its narrow side;

FIG. 11C shows a perspective view of the protective cover according to FIGS. 11A and 11B;

FIG. 13A shows the arrangement according to FIG. 6 when the protective cover is being pulled off from the semiconductor module;

FIG. 13B shows the semiconductor module shown in FIG. 13A after removal of the protective cover and before mounting of the semiconductor module on a heat sink;

FIG. 13C shows the arrangement according to FIG. 13B after mounting of the semiconductor module on the heat sink;

DETAILED DESCRIPTION

Figure 1:
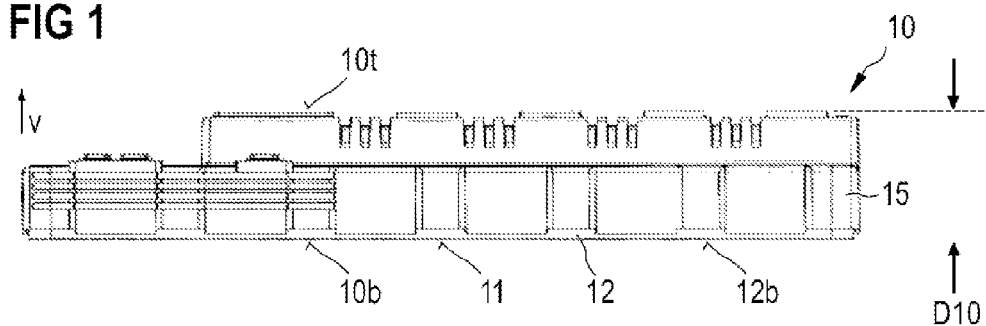
- FIG. 1 shows a side view of a semiconductor module.

FIG. 1 shows a side view of a semiconductor module 10. The semiconductor module 10 has a top side 10t and a bottom side 10b. The top side 10t is separated from the bottom side 10b in a vertical direction v. In the vertical direction v, the semiconductor module 10 has a first maximum thickness D10. The first maximum thickness D10 is a total thickness including the electrical connections belonging to the module. The semiconductor module 10 has a housing 15 which, for example, may consist of plastic. The semiconductor module 10 furthermore has a metal baseplate 12 with a bottom side 12b.

In the example shown, a section of the bottom side 10b of the semiconductor module constitutes a heat dissipation surface 11, onto which a thermal interface material can be applied. As shown for this semiconductor module 10 by way of example, the heat dissipation surface 11 may furthermore be formed by a section of the bottom side 12b of the baseplate.

At least one power semiconductor chip to be cooled via the heat dissipation surface 11 may be arranged in the housing 15. Such power semiconductor chips may for example be IGBTs, MOSFETs, J-FETs, thyristors, diodes or any other power semiconductor components, including in any combinations with one another.

Figure 2:
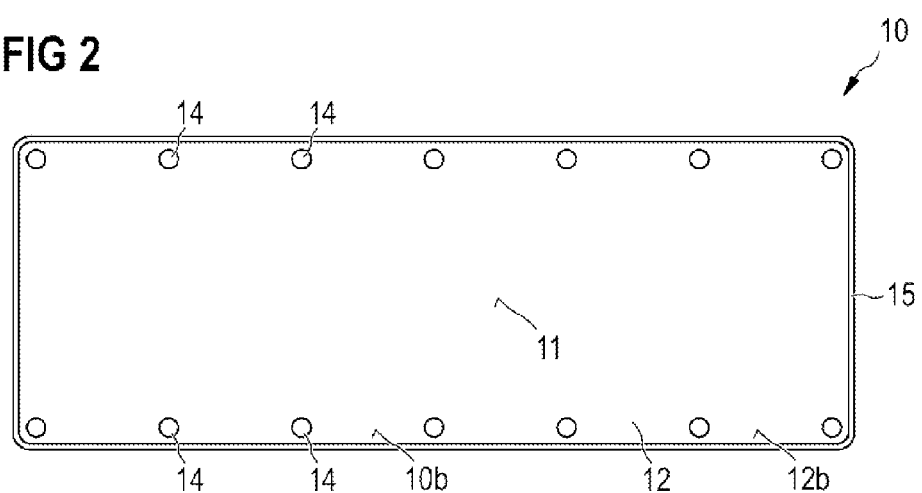
FIG. 2 shows a view of the bottom side of the semiconductor module according to FIG. 1 with a heat dissipation surface.

FIG. 2 shows the bottom side 10b of this semiconductor module 10. In this view, it can be seen that the baseplate 12 may optionally have a plurality of recesses 14. Such recesses may, for example, be formed as through-bores or as blind holes in the baseplate 12.

Figure 3:
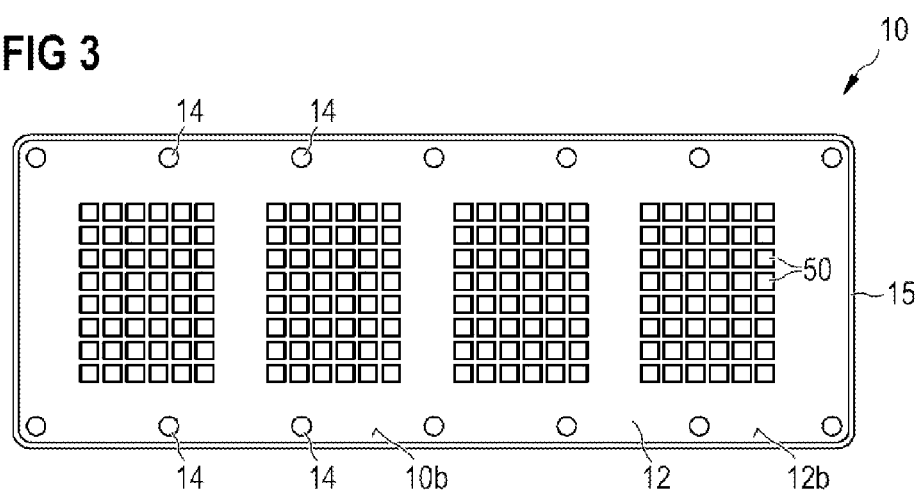
FIG. 3 shows a view of the bottom side of the semiconductor module according to FIGS. 1 and 2 after the application of a thermal interface material onto the heat dissipation surface.

FIG. 3 shows the semiconductor module 10 in the view according to FIG. 2 after the application of a thermal interface material 50. In the example shown, the application is structured. It comprises a plurality of groups, each with a number of segments. In principle, however, the manner of the application of the thermal interface material 50 is arbitrary. For example, the thermal interface material 50 may also be applied as a single continuous layer with a constant or variable thickness.

FIG. 4 again shows the semiconductor module 10 in the side view according to FIG. 1, but with the thermal interface material 50 applied according to FIG. 3 onto the heat dissipation surface 11, and with a protective cover 20 which can be mounted irreleasably on the semiconductor module 10. To this end, the protective cover 20 may optionally have a number N≥1 of projections 21, each of which can be fitted into a corresponding recess 14 (see FIG. 2) of the semiconductor module 10 so as to create a form-fit and/or force-fit connection.

The protective cover 20 furthermore has one or more trough-shaped sections 25 which, after the protective cover 20 is mounted on the semiconductor module 10, protect the thermal interface material 50 applied onto the heat dissipation surface 11 against external contact. Furthermore, each trough-shaped section 25 is configured in such a way that the mounted protective cover 20 does not touch the applied thermal interface material 50. Each trough-shaped section 25 may furthermore be free of through-openings in order to avoid the risk of contaminating the applied thermal interface material 50.

FIG. 5A shows a plan view of the top side of the protective cover 20 which can be mounted irreleasably on the semiconductor module 10, FIG. 5B shows a view of the protective cover on its narrow side, and FIG. 5C shows a perspective view.

A protective cover 20 may—in this and all other configurations—in principle be made of any solid material. For example, the protective cover 20 may be formed from a uniform homogeneous material. A protective cover 20 may, for example, be produced in a straightforward way from plastic by injection molding or hot forming. Likewise, a protective cover 20 may also consist of metal, or it may comprise metal components and/or plastic components.

The plastic of which a protective cover 20 consists, or which a protective cover 20 comprises, may for example be PS (polystyrene), EC-PS (electrically conductive polystyrene), PET (polyethylene terephthalate) or the like.

In principle, a protective cover 20, in particular before it is mounted irreleasably on a semiconductor module 10, may be formed in one piece.

FIG. 6 shows a side view of the semiconductor module 10 according to FIG. 4 after mounting of the protective cover 20 on the semiconductor module 10. To this end, each of the projections 21 has been fitted into a corresponding recess 14 (see FIG. 2) of the semiconductor module 10 so as to create a form-fit and/or force-fit connection.

FIG. 7 shows an enlarged view of a section of the protective cover 20 according to FIG. 5A in a cross section in the region of a section line A-A extending through one of the trough-shaped sections 25. In the vertical direction v, the protective cover 20 has a second maximum thickness D20. In this and any other configurations of the protective cover 20, the second maximum thickness D20 may be selected to be small in comparison with the first maximum thickness D10 of the semiconductor module 10. For example, the second maximum thickness D20 may be at most 40% of the first maximum thickness D10, and/or it may be less than or equal to 15 mm. As an alternative or in addition, the first maximum thickness D10 may be at least 10 mm. The aforementioned criteria for D10 and D20 apply both for the state in which the protective cover 20 is mounted irreleasably on the semiconductor module 10 and in the unmounted state.

As an alternative or in addition, provision may be made that, when it is mounted on the semiconductor module 10, the protective cover 20 does not extend beyond the semiconductor module 10 in any direction perpendicular to the vertical direction v, or extends beyond it by no more than 2 mm.

The effect achievable by a small thickness D20 and/or by a small lateral overhang is that the unit comprising the semiconductor module 10 and the protective cover 20 mounted thereon occupies only slightly more space than the semiconductor module 10 itself, so that in the ideal case the same transport packages as have previously been used for transporting only the semiconductor module may be used for transporting the unit.

FIG. 8A again shows the section of the protective cover 20 according to FIG. 7, but before it is mounted on the semiconductor module 10, only a section of the baseplate 12 of the semiconductor module 10 with the thermal interface material 50 applied thereon being represented for simplicity.

As is likewise shown in FIG. 8A, a solid metal baseplate 12 may have a thickness D12 in the vertical direction v, which— in this and all other configurations of a semiconductor module 10 with a solid metal baseplate 12—may for example be at least 1 mm.

FIG. 8B shows the arrangement after mounting of the protective cover 20 on the semiconductor module 10. Optionally, when the protective cover 20 is mounted, a section of a top side 20t of the protective cover 20, lying opposite the heat dissipation surface 11 and facing toward the bottom side 10b, may lie at a distance d1 of at least 1 mm from the heat dissipation surface 11.

Likewise optionally, when the protective cover 20 is mounted and when thermal interface material 50 is applied onto the heat dissipation surface 11, a section of a top side 20t of the protective cover 20, lying opposite the thermal interface material 50 and facing toward the bottom side 10b, may lie at a distance d2 of at least 1 mm from the thermal interface material 50.

The aforementioned lower limits for d1 and d2 may optionally also be selected to be higher, for example when the protective cover 20 is very flexible owing to the material used, the material thickness used or the selected geometry, or when a higher safety distance between the thermal interface material 50 and the protective cover 20 is simply desired, or when the intention is to provide the possibility of applying the thermal interface material 50 onto the heat dissipation surface 11 with a greater thickness. For example, d1 may also be selected to be greater than or equal to 3 mm or even greater than or equal to 5 mm. Likewise, d2 may also be selected to be greater than or equal to 3 mm or even greater than or equal to 5 mm.

Figure 8C:
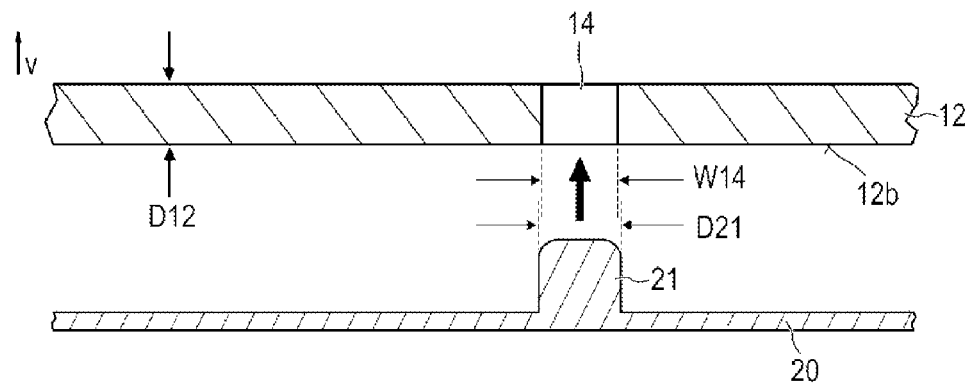
FIG. 8C shows an enlarged view of a section of the protective cover according to FIG. 5A along a section line B-B extending through a projection of the protective cover, before mounting of the protective cover on the semiconductor module.

FIG. 8C shows an enlarged view of a section of the protective cover 20 according to FIG. 5A in a section plane through a section line B-B before mounting of the protective cover 20 on the semiconductor module 10. The section plane extends through one of the projections 21 and through one of the recesses 14 of the baseplate 12. In this common section plane, the projection 21 has a width D21 perpendicular to the vertical direction v. The recess 14 has—likewise in this section plane and perpendicular to the vertical direction v—a breadth W14 which is less than the width D21, so that the projection 21 has an oversize relative to the recess 14. By pressing the projection 21 into the recess 14, a force-fit connection, by which the protective cover 20 is connected irreleasably to the semiconductor module 10, is formed between the projection 21 and the recess 14, and therefore between the protective cover 21 and the semiconductor module 10.

Figure 9A:
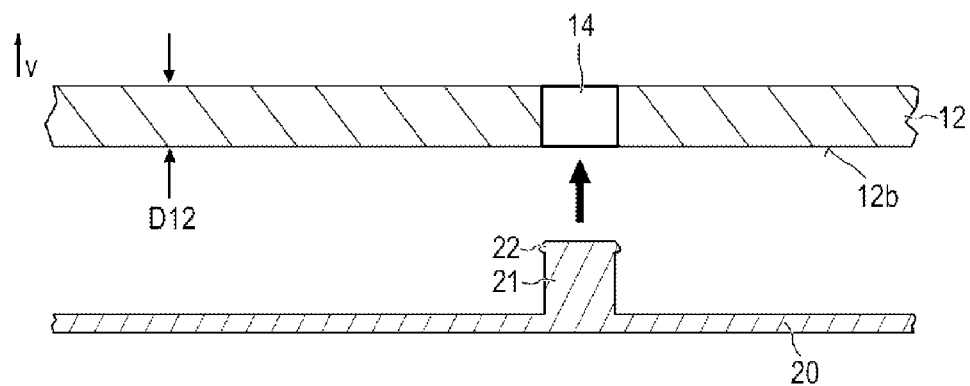
FIG. 9A shows a view corresponding to the view according to FIG. 8C, with a section of a protective cover in which the projection has a latching lug.

FIG. 9A shows a view, corresponding to the view according to FIG. 8C, with a section of a protective cover 20, in which the projection 21 has a latching lug 22. In the region of the latching lug 22, the projection 21 has an oversize relative to the recess 14.

Figure 9B:
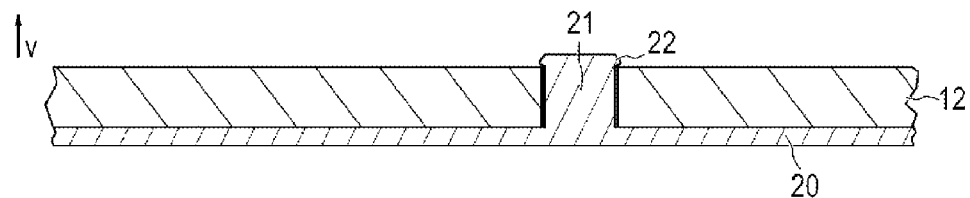
FIG. 9B shows the arrangement according to FIG. 9A after latching of the protective cover with the semiconductor module.

FIG. 9B shows the arrangement according to FIG. 9A after the projection 21 is pressed into the recess 14 and after the latching lug 22, and therefore the protective cover 20, is latched to the semiconductor module 10.

Figure 9C:
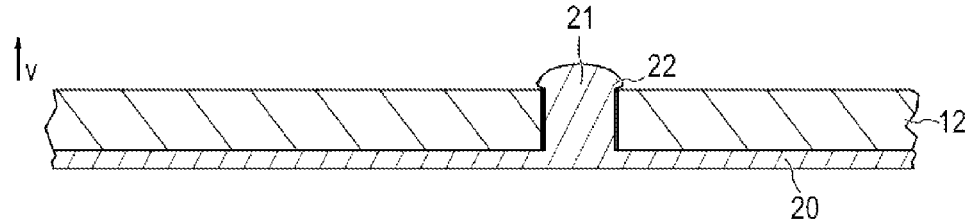
FIG. 9C shows an arrangement according to FIG. 9B, in which the latching lug is formed as a mushroom head.

According to an alternative configuration, shown in FIG. 9C, a latching lug 22 may for example also be produced by forming the projection as a mushroom head.

FIG. 10 shows a side view of a semiconductor module 10 provided with a thermal interface material 50 and of a protective cover 20, which can be mounted thereon and which—unlike the protective cover 20 explained above—does not have any projections 21 with which it can be fastened irreleasably on the semiconductor module 10. Instead, the protective cover is adhesively bonded to the semiconductor module 10. To this end, the protective cover 20 has a contact surface 23, it being possible to apply the protective cover 20 onto the bottom side 10b of the semiconductor module 10 in such a way that each point of the contact surface 23 makes contact with the semiconductor module 10. This means that the contact surface 23 bears surface-wide on the bottom side 10b of the semiconductor module 10. By virtue of this configuration, the cover 20 can be adhesively bonded to the semiconductor module 10 in a simple way with the aid of an adhesive, and thereby connected irreleasably thereto. The contact surface 23 may be formed as an elongate strip which, for example, may have a width B23 of at least 0.25 mm or at least 4 mm.

FIG. 11A shows a plan view of the top side 23 of the protective cover 20 represented in FIG. 10, FIG. 11B shows a view on its narrow side, and FIG. 11C shows a perspective view.

Figure 12A:
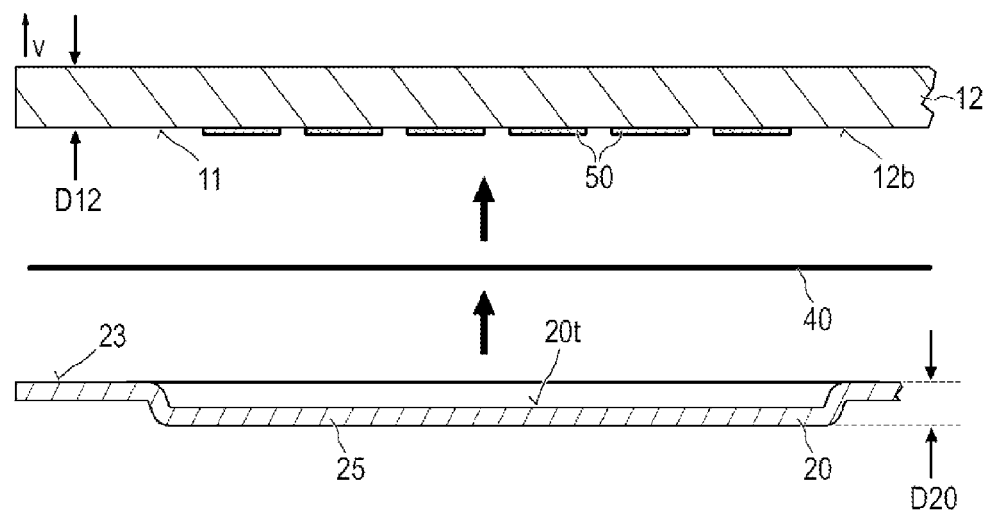
FIG. 12A shows an enlarged view of a section of the protective cover according to FIG. 11A in a section plane along a section line C-C before adhesive bonding of the protective cover to a semiconductor module.

An enlarged cross-sectional view of a section of the protective cover 20 according to FIG. 11A along a section line C-C is represented in FIG. 12A. Likewise shown are a section of a baseplate 12 of the semiconductor module 10 and a part of a thermal interface material 50 applied onto the contact surface 11. To simplify the representation, the other components of the semiconductor module 10 are not shown. An adhesive 40, by means of which the protective cover 20 is adhesively bonded irreleasably to the semiconductor module 10, is also represented schematically between the semiconductor module 10 and the protective cover 20. The adhesive 40 may be applied onto the contact surface 23 of the protective cover 20 and/or onto the bearing surface of the contact surface on the semiconductor module 10 before the semiconductor module 10 and the protective cover 20 are joined together. As the adhesive 40, in principle it is possible to use any adhesive which can be released again when the protective cover 20 is intended to be removed from the semiconductor module 10, for example in order to mount the semiconductor module 10 on a heat sink. As the adhesive 40, for example, it is possible to use an adhesive comprising a volatile organic solvent, or a glue, that is to say an aqueous adhesive solution. In principle, hot-melt adhesives, which are solid at room temperature and begin to melt at temperatures significantly above room temperature, are also suitable.

One possible configuration of an adhesive 40 consists of an adhesive whose adhesive force decreases with increasing temperature, so that pulling of the protective cover 20 off from the semiconductor module 10 can be assisted straightforwardly by heating the adhesive 40. Such an adhesive may be used as it is, or alternatively applied onto both sides of a flat carrier tape so that the carrier tape coated on both sides with the adhesive can be used as an adhesive tape, in such a way that one of its sides can be adhesively bonded to the semiconductor module 10 and the other side can be adhesively bonded to the protective cover 20.

Likewise, it is also possible to use an adhesive 40 which is adapted to the material of the contact surface, to be adhesively bonded, of the semiconductor module 10, in such a way that, when the protective cover 20 is pulled off from the semiconductor module 10, it remains entirely on the protective cover 20 and the semiconductor module 10 is free of adhesive residues.

Another possible configuration of an adhesive 40 consists of an adhesive which breaks when the protective cover 20 is removed from the semiconductor module 10.

Figure 12B:
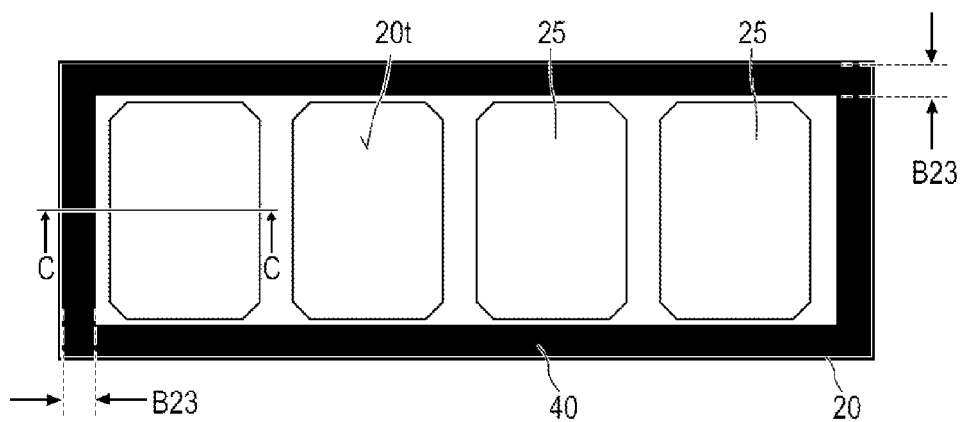
FIG. 12B shows a plan view of the protective cover according to FIG. 11A after application of the adhesive on the protective cover.
Figure 12C:
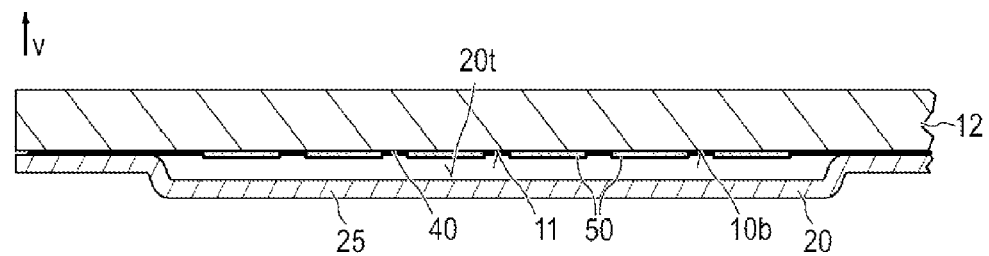
FIG. 12C shows the view according to FIG. 12A after adhesive bonding of the protective cover to the semiconductor module by using the adhesive.

FIG. 12B shows a plan view of the protective cover according to FIG. 11A after application of the adhesive 40 onto the contact surface 23 of the protective cover 20, and FIG. 12C shows the view according to FIG. 12A after adhesive bonding of the protective cover 20 to the semiconductor module 10 by using the adhesive 40.

In order to mount a semiconductor module 10, provided first with a thermal interface material 50 and then with a protective cover 20, on a heat sink 30, the protective cover 20 is first removed from the semiconductor module 10, which may for example be done by pulling the protective cover 20 off from the semiconductor module 10. In this case, the adhesive 40 may optionally also be removed fully or partially from the semiconductor module 10. In principle, however, it is also possible to leave the adhesive 40 fully or partially on the semiconductor module 10, if the application in question permits this. In any event, the thermal interface material 50 is exposed after the protective cover 20 is removed, so that the semiconductor module 10 can be placed on the heat sink 30 in such a way (represented by an arrow in FIG. 13B) that the thermal interface material 50 makes contact with the heat sink 30, the outcome of which is shown in FIG. 13C. In order to connect the semiconductor module 10 to the heat sink 30, it is possible to use any connection techniques, for example screwing or latching.

In the examples explained above with reference to FIGS. 1 to 9B, the recesses 14 for receiving the projections 21 were provided in a solid baseplate 12 of the semiconductor module 10. Nevertheless, the principle according to the invention can also be implemented with a so-called "baseplateless" semiconductor module 10, that is to say with a semiconductor module 10 in which the heat dissipation surface 11 is not formed by a section of a bottom side 12b of a solid baseplate 12 (that is to say a baseplate 12 of large thickness D12).

Figure 14A:
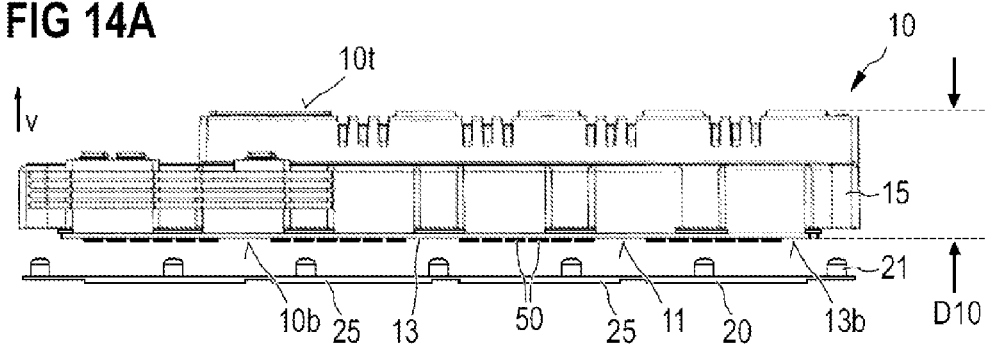
FIG. 14A shows a side view of an arrangement which differs from the arrangement according to FIG. 4 in that the protective cover has projections which are formed in order to engage in recesses of a plastic housing of the semiconductor module.

As shown in FIG. 14A, instead of a solid baseplate 12 of this type, the semiconductor module 10 may also have a dielectric insulation carrier 16 formed as a thin plate (FIG. 14B), which is provided with a thin metallization layer 13 on its bottom side 16b facing away from the top side 10t of the semiconductor module 10. A section of the bottom side 13b, facing away from the insulation carrier 16, of the thin metallization layer 13 in this case forms the heat dissipation surface 11. The thin metallization layer 13 has a thickness D13 in the vertical direction v which, for example, may be less than or equal to 3 mm.

The dielectric insulation carrier 16 may optionally be formed as a thin ceramic plate which, for example, may consist of aluminum oxide ($Al_2O_3$), aluminum nitride (AlN) or silicon nitride ($Si_3N_4$), or any other desired electrically insulating ceramic. The thin metallization layer 13 may, for example, consist of copper, aluminum, an alloy of at least one of these metals, or any other desired metal.

Figure 14B:
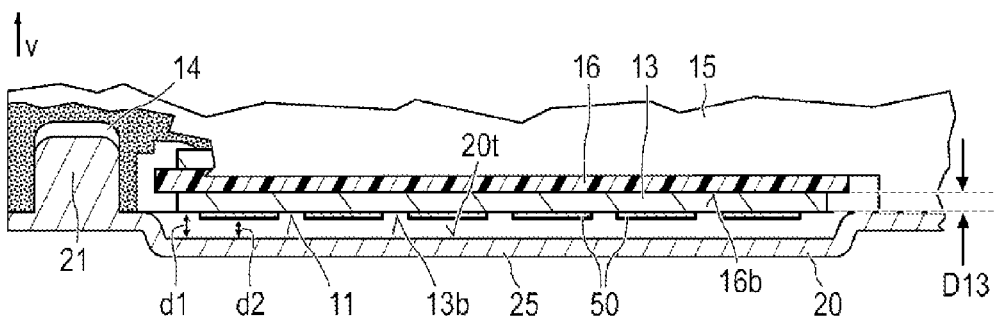
FIG. 14B shows a side view of an enlarged section of the arrangement according to FIG. 14A after mounting of the protective cover on the semiconductor module.

Since in such a configuration there is no solid baseplate 12, in which recesses 14 for receiving projections 21 of a protective cover 20 can be introduced, the recesses 14 are provided in the housing 15 of the semiconductor module 10. FIG. 14B shows an enlarged section of the arrangement according to FIG. 14A, the housing 15 being represented partially cut away in the left-hand part of the figure, in order to show the way in which a projection 21 of the protective cover 20 is pressed with a force fit into a recess 14 in the housing 15. In the example shown, the recess 14 is arranged as a blind hole in the housing 15.

As an alternative to this, however, the recess 14 may also be formed as a through-opening in the housing, for example when the latter has a flange through which the recess 14 extends. In the case of a recess 14 formed as a through-opening, the projection 21 could—as explained above with the aid of FIGS. 9A and 9B—have a latching lug 22 which latches with the housing 15 so as to create a form-fit connection between the semiconductor module 10 and the protective cover 20 after the projection 21 is introduced into the recess 14.

Figure 15A:
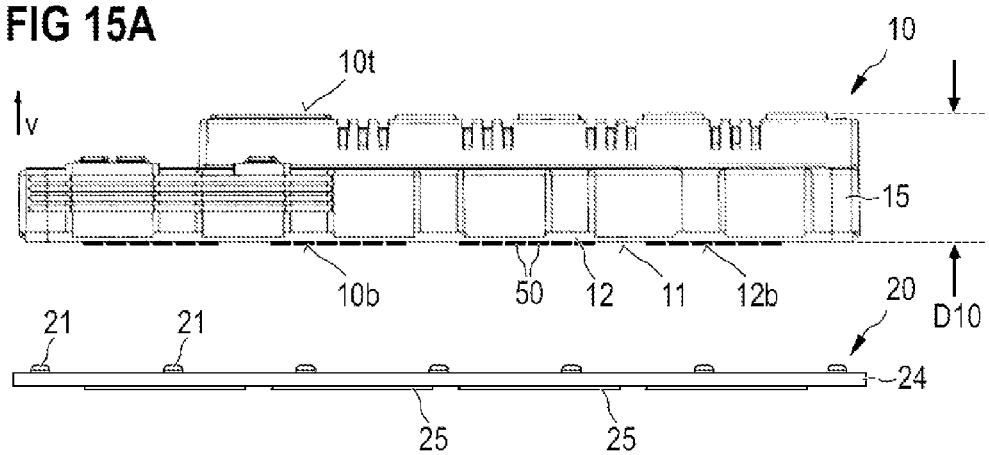
FIG. 15A shows a side view of an arrangement which differs from the arrangement according to FIG. 4 in that the protective cover has a continuous annular circumferential edge which engages laterally around the semiconductor module on its bottom side in the mounted state.
Figure 15B:
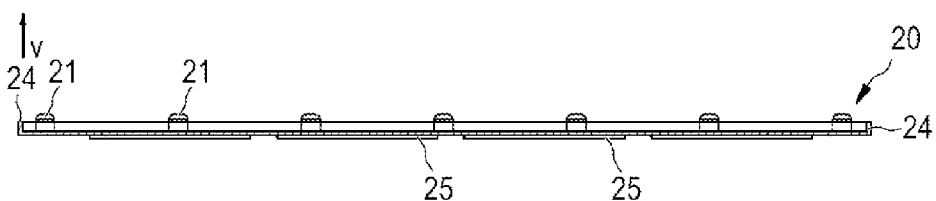
FIG. 15B shows a vertical section through the protective cover shown in FIG. 15A.
Figure 15C:
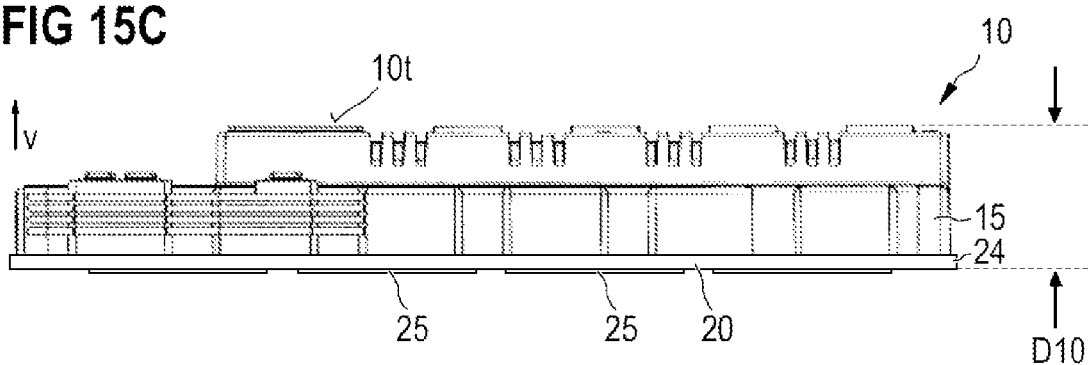
FIG. 15C shows a side view of the arrangement according to FIG. 15A after mounting of the protective cover on the semiconductor module.

In order to avoid a large gap between the semiconductor module 10 and the protective cover 20 in the case of a protective cover 20 mounted irreleasably on a semiconductor module 10, the protective cover 20 may have a continuous annular circumferential edge 24 which, in the mounted state, follows the outer contour of the semiconductor module 10, for example the outer contour of a baseplate 12, and by which the protective cover 20 engages laterally around the semiconductor module 10 on its bottom side 10b. An example of this is represented in FIGS. 15A to 15C. The arrangement according to FIG. 15A differs from the arrangement according to FIG. 4 merely in that the protective cover 20 additionally has a circumferential edge 24. In order to illustrate the circumferential edge 24, FIG. 15B shows a vertical section through the protective cover 20. In FIG. 15C, the protective cover 20 is already mounted on the semiconductor module 10. Owing to the circumferential edge 24, the protective cover 20 engages around the edges located on the bottom side 10b of the semiconductor module 10, and therefore also around the gap between the bottom side 10b and the protective cover 20. A circumferential edge 24 of a protective cover 20 may also be produced in all other configurations of the invention.

In all configurations of the invention, the heat dissipation surface 11 may be planar. The vertical direction v then extends perpendicularly to the heat dissipation surface 11.

Likewise, in all configurations of the invention it is possible to configure the protective cover 20 in such a way that it is necessarily broken, for example torn and/or permanently crushed, during removal from the semiconductor module 10. In this way, it is possible to verifiably ensure that the protective cover 20 has not yet been removed and then reapplied after its first application on the semiconductor module 10.

Furthermore, in all configurations a protective cover 20 may be mechanically stabilized, for example by providing it with stiffening contours. Such stiffening contours may, for example, be obtained by each trough-shaped section 25 having an octagonal base surface, as shown for example in FIGS. 5A, 5C, 11A, 11C and 12B.

In the examples explained above, the protective cover 20 was respectively provided with four trough-like sections 25. In principle, however, a protective cover 20 may also have precisely one, precisely two, precisely three, precisely five, precisely six, or more than six trough-shaped sections 25. In the case of a larger number of trough-shaped sections 25 of a protective cover 20, these may for example be arranged successively in a single row, or alternatively in the form of a matrix in at least two rows and at least two columns.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor module system, comprising:
    a semiconductor module having a bottom side with a heat dissipation surface and a top side opposite the bottom side, the top side separated from the bottom side in a vertical direction;
    a protective cover configured to be mounted irreleasably on the semiconductor module in such a way that, in a mounted state, the top side is exposed and the protective cover covers the heat dissipation surface,
    wherein the heat dissipation surface is planar.

2. The semiconductor module system of claim 1, wherein:
    the semiconductor module has a first maximum thickness in the vertical direction; and
    in the mounted state, the protective cover has a second maximum thickness in the vertical direction which is less than or equal to 15 mm and/or is at most 40% of the first maximum thickness.

3. The semiconductor module system of claim 1, wherein, in the mounted state, the protective cover does not extend beyond the semiconductor module in any direction parallel to the heat dissipation surface by no more than 2 mm.

4. The semiconductor module system of claim 1, wherein, when the protective cover is mounted, a section of a top side of the protective cover lying opposite the heat dissipation surface and facing toward the bottom side lies at a distance of at least 1 mm from the heat dissipation surface.

5. The semiconductor module system of claim 1, wherein the heat dissipation surface is formed by a section of a bottom side facing away from the top side of the semiconductor module, of a metal baseplate of the semiconductor module, which has a thickness of at least 1 mm in the vertical direction.

6. The semiconductor module system of claim 1, wherein:
    the semiconductor module has a dielectric insulation carrier formed as a thin plate provided with a metallization layer on its bottom side facing away from the top side of the semiconductor module; and
    the heat dissipation surface is formed as a section of the bottom side facing away from the insulation carrier of the metallization layer.

7. The semiconductor module system of claim 1, wherein the protective cover is configured to be mounted irreleasably with the semiconductor module such that the protective cover has a number N ≥ 1 of projections, each of which is configured to fitted into a corresponding recess of the semiconductor module so as to create a form-fit and/or force-fit connection.

8. The semiconductor module system of claim 7, wherein:
   each of the projections has an oversize relative to the corresponding recess in an unmounted state; and/or each of the projections has a latching lug configured to latch with the semiconductor module in the mounted state.

9. The semiconductor module system of claim 7, wherein each recess is formed as a through-opening or as a blind hole of a metal baseplate or of a plastic housing of the semiconductor module.

10. The semiconductor module system of claim 1, wherein:
   the protective cover is configured to be mounted irreleasably with the semiconductor module such that the protective cover has a contact surface;
   the protective cover is configured to be placed on the bottom side of the semiconductor module such that the contact surface bears surface-wide on the bottom side of the semiconductor module;
   the protective cover is configured to be adhesively bonded to the semiconductor module on the contact surface by means of an adhesive; and
   the contact surface is formed as an elongated strip having a width of at least 0.25 mm.

11. The semiconductor module system of claim 1, wherein the protective cover has a continuous annular circumferential edge which, in the mounted state, follows an outer contour of the semiconductor module and by which the protective cover engages laterally around the semiconductor module on the bottom side in the mounted state.

12. The semiconductor module system of claim 1, wherein the protective cover is formed in one piece in an unmounted state.

13. The semiconductor module system of claim 1, wherein the protective cover comprises plastic.

14. The semiconductor module system of claim 1, wherein the protective cover comprises a uniform homogeneous material.

15. A semiconductor module arrangement, comprising:
   a semiconductor module system comprising a semiconductor module having a bottom side with a heat dissipation surface and a top side opposite the bottom side, the top side separated from the bottom side in a vertical direction, and a protective cover configured to be mounted irreleasably on the semiconductor module in such a way that, in a mounted state, the top side is exposed and the protective cover covers the heat dissipation surface; and
   a thermal interface material applied onto the heat dissipation surface,
   wherein the protective cover is mounted irreleasably on the semiconductor module and separated from the thermal interface material.

16. The semiconductor module arrangement of claim 15, wherein a section, lying opposite the thermal interface material, of a side of the protective cover facing toward the bottom side lies at a distance of at least 1 mm from the thermal interface material in the vertical direction.

17. The semiconductor module arrangement of claim 15, wherein a section, lying opposite the thermal interface material, of a side of the protective cover facing toward the bottom side lies at a distance of at least 1 mm from the bottom side of the semiconductor module in the vertical direction.

18. The semiconductor module arrangement of claim 15, wherein the thermal interface material comprises a thermally conductive paste or a phase-change material.

19. A semiconductor module system, comprising:
   a semiconductor module having a bottom side with a heat dissipation surface and a top side opposite the bottom side, the top side separated from the bottom side in a vertical direction;
   a protective cover configured to be mounted irreleasably on the semiconductor module in such a way that, in a mounted state, the top side is exposed and the protective cover covers the heat dissipation surface; and
   a semiconductor chip arranged within the module between the heat dissipation surface and the top side.

* * * * *